United States Patent [19]

Harima et al.

[11] Patent Number: 5,440,512
[45] Date of Patent: Aug. 8, 1995

[54] SEMICONDUCTOR MEMORY DEVICE

[75] Inventors: Takayuki Harima, Kawaguchi; Makoto Segawa, Yokohama, both of Japan

[73] Assignee: Kabushiki Kaisha Toshiba, Kawasaki, Japan

[21] Appl. No.: 44,115

[22] Filed: Apr. 8, 1993

Related U.S. Application Data

[63] Continuation of Ser. No. 611,071, Nov. 9, 1990, abandoned.

[30] Foreign Application Priority Data

Nov. 10, 1989 [JP] Japan .................................. 1-292991

[51] Int. Cl.$^6$ .............................................. G11C 7/00
[52] U.S. Cl. ..................................... 365/190; 365/208; 365/189.09; 365/230.06; 365/230.08
[58] Field of Search ........... 365/190, 207, 208, 230.06, 365/230.01, 230.08, 189.09

[56] References Cited

U.S. PATENT DOCUMENTS

| | | | |
|---|---|---|---|
| 4,348,747 | 9/1982 | Takahashi | 365/230.08 |
| 4,376,989 | 3/1983 | Takemae | 365/230.08 |
| 4,385,369 | 5/1983 | Sheppard | 365/230.08 |
| 4,393,480 | 7/1983 | Shimada | 365/230.08 |
| 4,888,737 | 12/1989 | Sato | 365/190 |
| 4,951,259 | 8/1990 | Sato et al. | 365/230.06 |
| 4,965,770 | 10/1990 | Yanagisawa | 365/230.06 |
| 5,105,389 | 4/1992 | Matsuo et al. | 365/230.08 |

*Primary Examiner*—Joseph E. Clawson, Jr.
*Attorney, Agent, or Firm*—Foley & Lardner

[57] ABSTRACT

A semiconductor memory device includes an address input circuit for receiving an address signal and outputting an internal address signal corresponding to the received address signal; an address decoder for decoding the internal address signal and outputting a decoded signal; a memory cell array having a plurality of memory cells each capable of storing data, as selected by the decoded signal, the selected memory cell outputting memory cell data; and an output circuit for outputting a truth data and false data at the same time in accordance with the output memory cell data of the selected memory cell.

8 Claims, 5 Drawing Sheets

SEMICONDUCTOR MEMORY DEVICE

FIELD OF THE INVENTION

This application is a continuation of application Ser. No. 07/611,071, filed Nov. 9, 1990, now abandoned.

The present invention relates to a semiconductor memory device, and more particularly to a semiconductor memory device characterized in its output circuit or output buffer.

BACKGROUND OF THE INVENTION

In order to output a data from a semiconductor integrated circuit such as a semiconductor memory, it is necessary to establish a stable output potential by charging or discharging an output load at high speed. However, high speed charge/discharge of a load capacitor at the output side results in disturbance of a power supply voltage and ground potential because of rapid excessive load current. If a high speed operation is to be realized, the voltage disturbance becomes correspondingly large. This voltage disturbance is mainly determined by $L \times di/dt$ which is a product of a differential coefficient $di/dt$ of a charge/discharge current and a parasitic inductance L of the path through which the charge/discharge current flows.

FIG. 1 is a circuit diagram of a semiconductor device of the background art. In FIG. 1, a circuit portion surrounded by a broken line represents a memory chip MCH. T1 represents a power supply voltage terminal for supplying a power supply potential to the memory chip, T2 represents a ground voltage terminal for supplying ground potential, T3 represents a data output terminal for outputting a data, and T4 represents an address input terminal for inputting an n-bit address (Ai). MCA represents a memory cell array, MC represents a memory cell, and DC represents an address decoder. D.C. power is supplied between the power supply voltage terminal T1 and ground voltage terminal T2 from a d.c. power source 111. The D.C. power source 111 is provided with a stabilizing capacitor 112 which absorbs noise on power supply lines. An n-bit address Ai is decoded by the address decoder DC to output a decoded signal. This decoded signal is used for selecting one memory cell MC within the memory cell array MCA. Data d of the selected MC is outputted as complementary data signals d and d̄. More specifically, an address signal Ai from the address input terminal T4 is supplied via an address input circuit (not shown) and used for reading a memory cell MC. The memory cell produces output drive signals d and d̄ which are inputted to the gates of an "1" level output transistor 11 and "0" level output transistor 12, respectively. The interconnection between the "1" and "0" level output transistors 11 and 12 is connected to the data output terminal T3 of the memory chip MCH.

Between the positive terminal of the D.C. power source 111 and the power supply voltage terminal T1, there is a series circuit of an integrated circuit external parasitic inductor 16 and an integrated circuit external parasitic resistor 13. Between the negative terminal of the D.C. power source 11 and the ground voltage terminal T2, there is a series circuit of an integrated circuit external parasitic inductor 17 and an integrated circuit external parasitic resistor 14. Between the power supply voltage terminal T1 and the ground voltage terminal T2 within the memory chip MCH, there is an integrated circuit internal inter-terminal capacitor 19. At the output side of the data output terminal T3, there are an integrated circuit external parasitic inductor 18 and an integrated circuit external parasitic resistor 15 in series with the load capacitor 110.

With the circuit arrangement described above, data "0" is outputted from the data output terminal T3 in the following manner. Namely, the output drive data signal d̄ is placed at a high level, to make the "0" level output transistor 12 conductive. Then, the electric charge of the load capacitor 110 is discharged to a path I via the data output terminal T3 so that the output level is established and a data "0" is outputted. In this case, noise is generated at the ground voltage terminal T2 because of the discharge current Id from the load capacitor 110 and the external parasitic resistors 14 and 15 are external parasitic inductors 17 and 18. Noise is also generated at the power supply voltage terminal T1 via the capacitor 19 within the memory chip MCH (coupling effect). Current also flows to a path II on the basis of a varying of potential at the terminal T1 at that time.

A series of such operations are represented by waveforms shown in FIG. 2 wherein the ordinate is voltage (volt) and the abscissa is time (t). FIG. 2 shows the changes of voltage levels at the power supply voltage terminal T1, ground voltage terminal T2, and data output terminal T3.

As seen from FIG. 2, as the level at the data output terminal T3 changes from the high level to the low level, large amounts of noise are generated at the power supply voltage terminal T1 and ground voltage terminal T2.

On the other hand, data "1" is outputted from the data output terminal T3 in the following manner. Namely, as shown in FIG. 3, the output drive data signal d is made high level to make the "1" level output transistor 11 conductive. Then, the load capacitor 110 is charged via the data output terminal T3 and a path III so that the output level is established and a data "1" is outputted. In this case, noise is generated at the power supply voltage terminal T1 because of the charge current Ic to the load capacitor 110 and the external parasitic resistors 13 and 15 and external parasitic inductors 16 and 18 of the path III. Noise is also generated at the ground voltage terminal T2 via the capacitor 19 within the memory chip MCH (coupling effect). Current also flows to a path IV on the basis of a varying of potential at the terminal T1 at that time.

A series of such operations are represented by waveforms shown in FIG. 4 wherein the ordinate is a voltage (volt) and the abscissa is a time (t). FIG. 4 shows the changes of voltage levels at the power supply voltage terminal T1, ground voltage terminal T2, and data output terminal T3.

As seen from FIG. 4, as the level at the data output terminal T3 changes from the low level to the high level, large amounts of noise are generated at the power supply voltage terminal T1 and ground voltage terminal T2.

In a semiconductor memory chip or the like having a plurality of data output terminals T3, noise generated at the power supply voltage terminal T1 and ground voltage terminal T2 become more conspicuous if data "0" or "1" is outputted from the data output terminals T3 at the same time. Noise at the power supply voltage terminal T1 and ground voltage terminal T2 cause corresponding noise to appear at the address input terminal T4. Such noise may cause an operation error or a delay in generating output data. If a charge/discharge current of the load capacitor is made small, noise can be reduced at the power supply voltage terminal T1 and ground voltage terminal T2. For this purpose, it becomes necessary to reduce the drive capacity of the "1" or "0" level output transistor 11, 12, i.e., to reduce the channel width of a MOS transistor. However, a limited drive capacity of an output transistor causes a delay of data access. Accordingly, the limited capacity of a transistor becomes a significant obstacle from the viewpoint of attaining high speed memory access. As described above, it is difficult for a conventional semiconductor device to sufficiently suppress the disturbance of power supply voltage and ground potential. Even if a load current is reduced, there occurs a new problem of redundancy of access time.

SUMMARY OF THE INVENTION

The present invention has been made in consideration of the above circumstances, and aims at providing a semiconductor memory device capable of suppressing noise generated at the power supply voltage and ground potential without degrading high speed data access.

A semiconductor memory device of this invention is constructed of the following elements including an address input means for receiving an address signal and outputting an internal address signal corresponding to the received address signal; an address decoder for decoding the internal address signal and outputting a decoded signal; a memory cell array having a plurality of memory cells each capable of storing a data and selected by the decoded signal, the selected memory cell outputting a memory cell data; and an output means for outputting truth data and false data at the same time in accordance with the output memory cell data of the selected memory cell.

DESCRIPTION OF THE PREFERRED EMBODIMENTS

An embodiment of the semiconductor memory device of this invention will be described with reference to the accompanying drawings.

Figure 1:
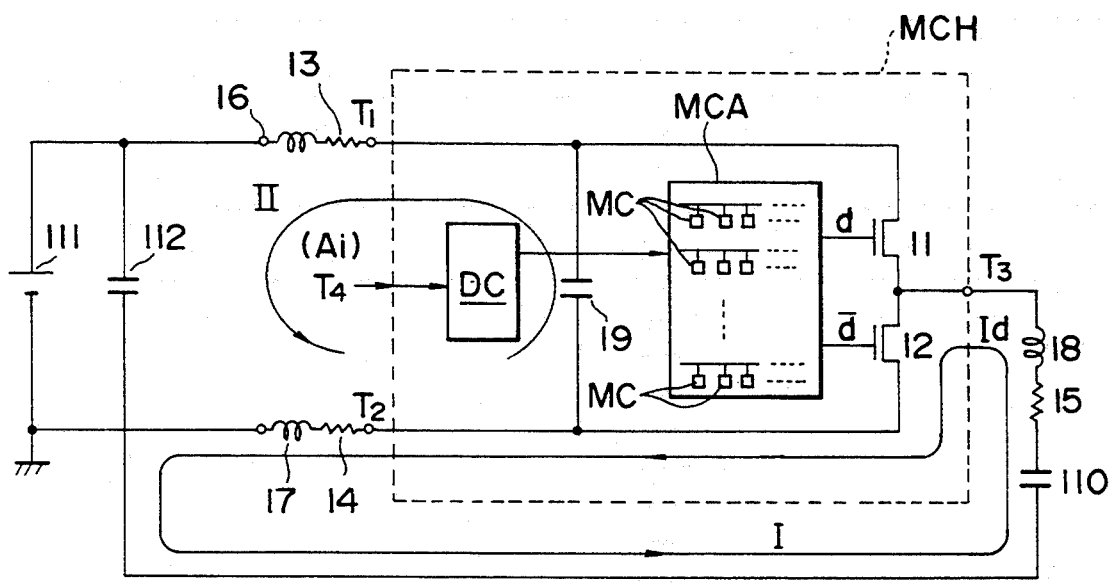
FIG. 1 is a circuit diagram of a semiconductor device of the background art.
Figure 2:
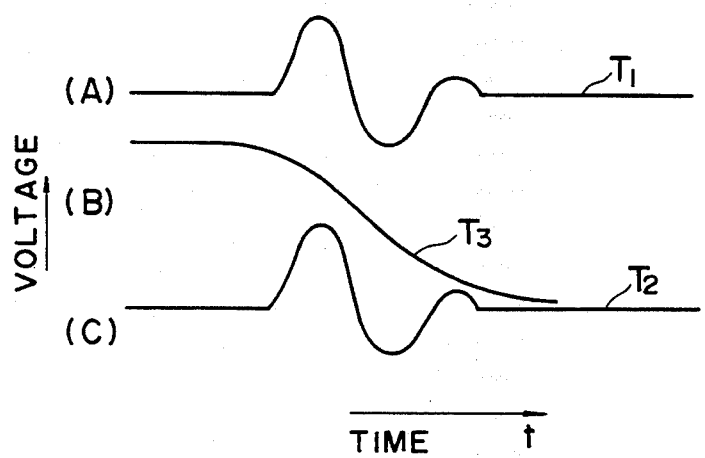
FIG. 2 shows waveforms used for explaining the operation of the circuit shown in FIG. 1.
Figure 3:
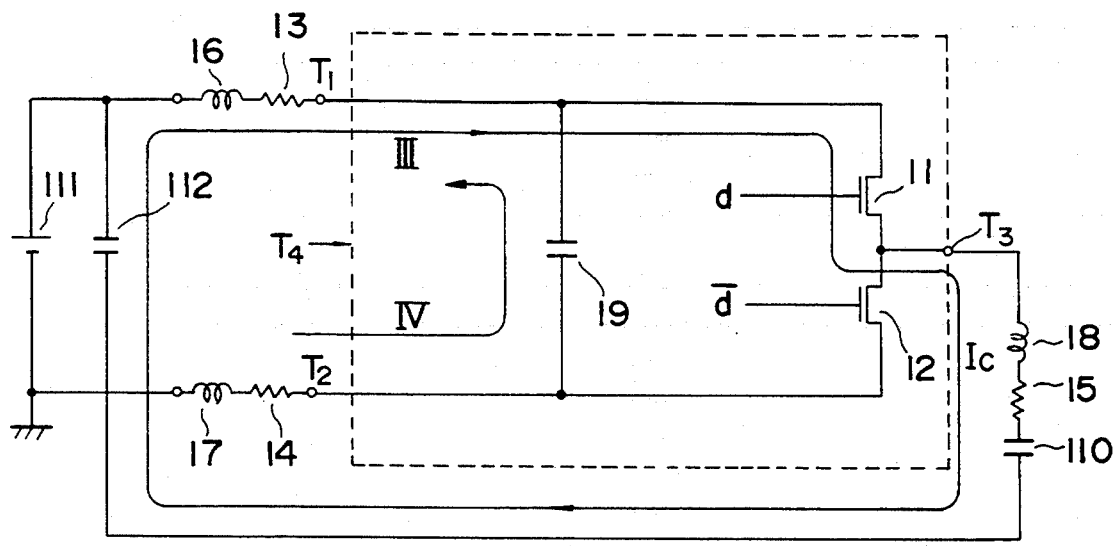
FIG. 3 is a circuit diagram showing other paths through which a current flows.
Figure 4:
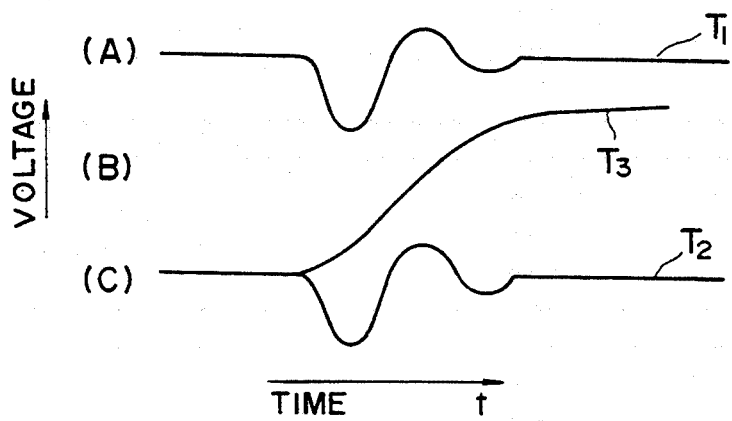
FIG. 4 shows waveforms used for explaining the operation when current flows through the paths shown in FIG. 3.
Figure 5:
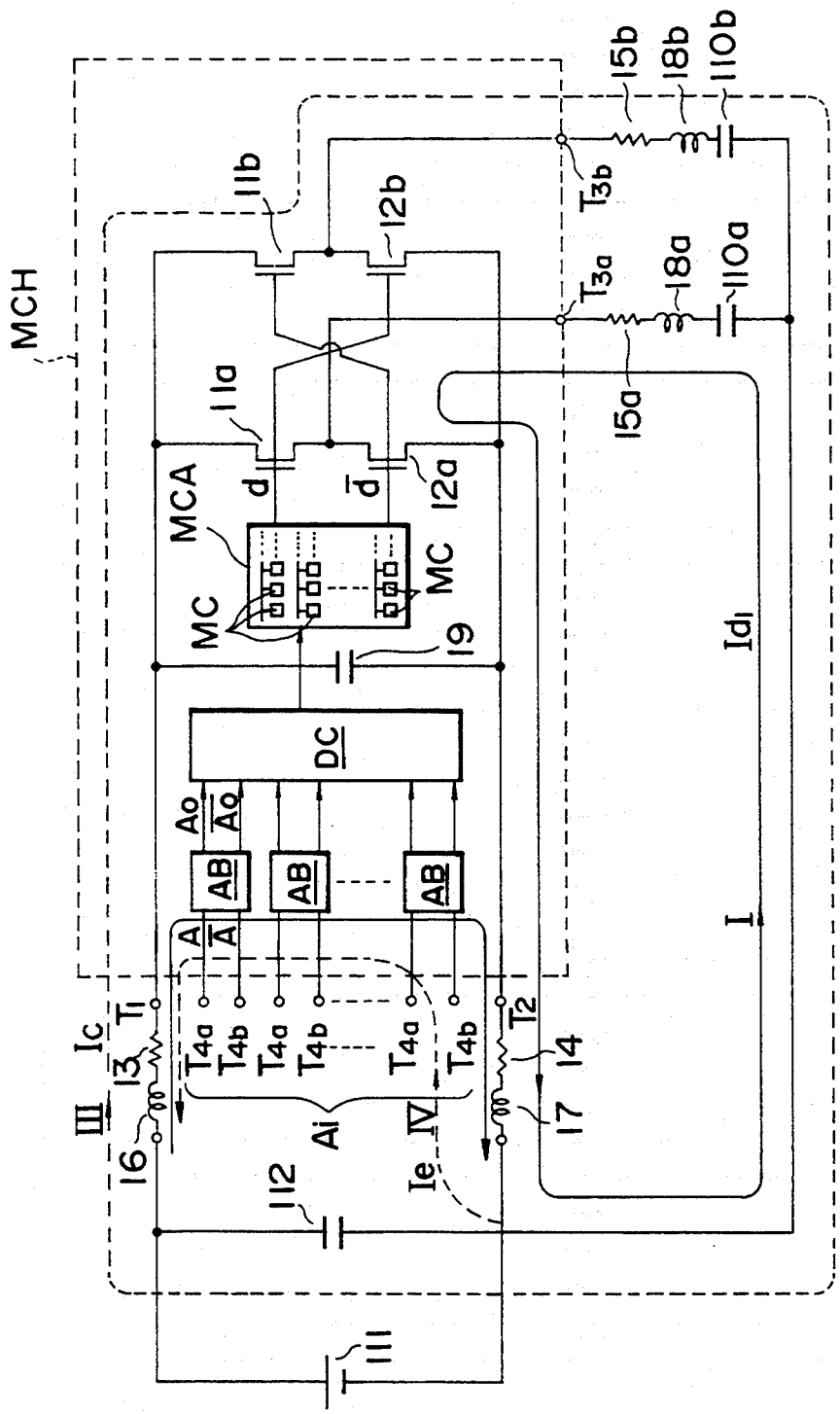
FIG. 5 is a circuit diagram of a semiconductor memory device according to an embodiment of this invention.

FIG. 5 is a circuit diagram showing a semiconductor memory device according to this invention. In FIG. 5, similar elements to those shown in FIG. 1 are represented by identical reference numerals. A circuit portion surrounded by a broken line represents a memory chip MCH. The memory chip MCH has $\bar{d}$ address input circuits AB each inputted with a truth value and a false value from a truth address input terminal T4a and a false address input terminal T4b, respectively. "Truth data" and "false data," and "truth address and false data" and "truth output and false output" are understood to be complementary to each other, respectively.

Each address input circuit AB outputs an internal address signal which is then applied to an address decoder DC. An output (decoded signal) from the address decoder DC selects one memory cell MC within a memory cell array MCA. A data read out of the selected memory cell MC is given to a data output unit as an output drive data signal d and an output drive data signal $\bar{d}$. Specifically, the data signal d is inputted to the gates of a "1" level output transistor 11a and a "0" level output transistor 12b. The output drive data signal $\bar{d}$ is inputted to the gates of a "0" level output transistor 12a and a "1" level output transistor 11b. The interconnection between the output transistors 11a and 12a is connected to a truth value data output terminal T3a. The interconnection between the transistors 11b and 12b is connected to a false value data output terminal T3b. The data output terminal T3a is connected to a series circuit of a load capacitor 110a, an integrated circuit external parasitic resistor 15a, and an integrated circuit external parasitic inductor 18a. The data output terminal T3b is connected to a series circuit of a load capacitor 110b, an integrated circuit external parasitic resistor 15b, and an integrated circuit external parasitic inductor 18b.

Figure 7:
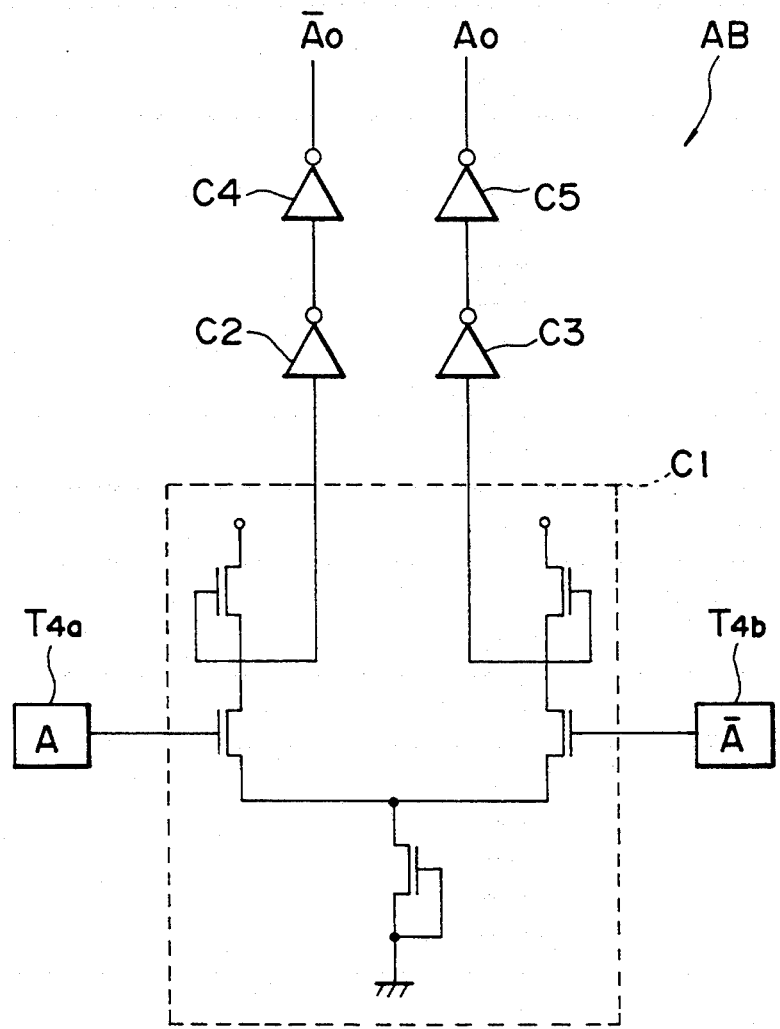
FIG. 7 is a circuit diagram showing the detailed structure of the address input circuit shown in FIG. 5.

FIG. 7 is a detailed circuit diagram of the first address input circuit AB shown in FIG. 5. As shown in FIG. 7, a truth value address A inputted from the truth value address input terminal T4a and a false value address $\bar{A}$ inputted from the false value address input terminal T4b are supplied to a differential amplifier stage C1. One of two outputs from the differential amplifier stage C1 is converted into an internal address signal $\overline{A0}$ via inverters C2 and C4. The other of the two outputs is converted into an internal address signal A0 via inverters C3 and C5. The internal address signals $\overline{A0}$ and A0 are supplied to the address decoder DC. As a result, output drive data signals d and $\bar{d}$ are read from the selected memory cell of the memory cell array. The other address input circuits AB have the same structure as shown in FIG. 7.

The operation of the semiconductor device constructed as above will be described.

Figure 6A:
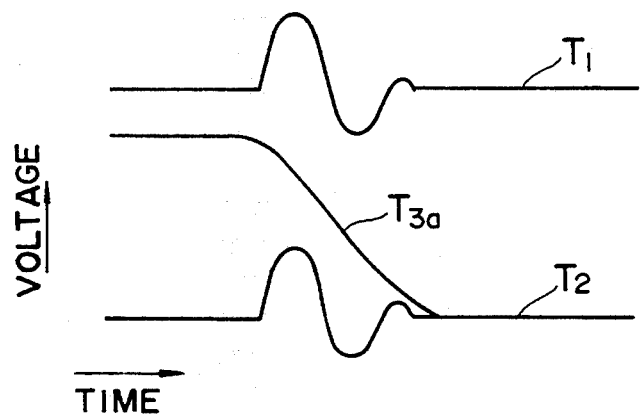
FIGS. 6A to 6C show waveforms used for explaining the operation of the circuit shown in FIG. 5.

A data "0" is outputted to the output terminal T3a in the following manner. First, the output drive data signal d is made to be a low level to make non-conductive the "1" and "0" level output transistors 11a and 12b. Thereafter, the output drive signal $\bar{d}$ is made high level to make conductive the "0" level output transistor 12a. As a result, the load capacitor 110a is discharged via the truth value data output terminal T3a and "0" level output transistor 12a, so that the output level at the output terminal T3a side is established at a data "0". In this case, the discharge is carried out along a path I shown in FIG. 5. Noise is generated at the ground voltage terminal T2 because of the discharge current Id1 from the load capacitor 110a, the external parasitic resistors 14 and 15a, and the external parasitic inductors 17 and 18a. Noise is also generated at the power supply voltage terminal T1 via the capacitor 19 within the memory chip MCH (coupling effect). Current Id2 also flows to a path II on the basis of a varying of potential at the terminal T1 at that time. Noise generated at the power supply voltage terminal T1 and ground voltage terminal T2 is shown in FIG. 6A.

Figure 6B:
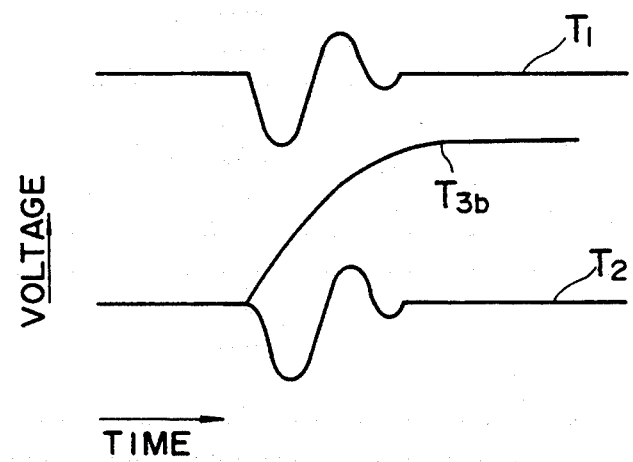

In the meantime, when the output drive data signal $\bar{d}$ is made to be a high level, the "1" level output transistor 11b is also made conductive. As a result, the load capacitor 110b is charged via the transistor 11b and the output terminal T3b, so that the output level at the output terminal T3b side is established at a data "1". In this case, the charge current Ic flows to a path III shown in FIG. 5. Noise is generated at the power supply voltage terminal T1 because of the charge current Ic, the external parasitic resistors 13 and 15b at the path III, and the external parasitic inductors 16 and 18b. Noise is also generated at the ground voltage terminal T2 via the capacitor 19 within the memory chip MCH (coupling effect). Current Ie also flows to a path IV on the basis of a varying of potential at the terminal T1 at that time. Noise generated at the power supply voltage terminal T1 and ground voltage terminal T2 is shown in FIG. 6B.

Figure 6C:
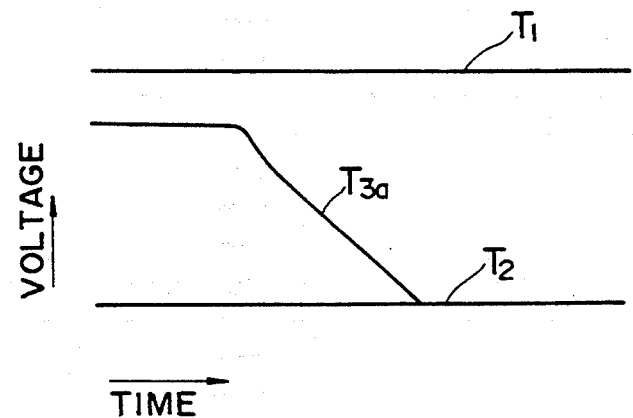

The data "0" and data "1" are outputted at the same time to the output terminals T3a and T3b, respectively. Therefore, the currents flowing to the paths I and IV shown in FIG. 5 are canceled currents flowing to paths II and III are also canceled. Therefore, currents flowing through the external parasitic inductors 16 and 17 and the external parasitic resistors 13 and 14 have a small differential coefficient di/dt. Noise generated at the power supply terminal T1 and ground voltage terminal T2, therefore, almost entirely disappear, as shown in FIG. 6C.

On the other hand, a data "1" is outputted to the output terminal T3a in the following manner. First, the output drive data signal $\bar{d}$ is put at a low level to make non-conductive the "1" and "0" level output transistors 11b and 12a. Thereafter, the output drive signal d is made high level to make conductive the "1" level output transistor 11a. As a result, the load capacitor 110a is charged via the transistor 11a and the truth value data output terminal T3a, so that the output level at the output terminal T3a side is established at a data "1". In this case, the "0" level output transistor 12b becomes conductive at the same time. As a result, the load capacitor 110b is discharged via the output terminal T3b and the transistor 12b, so that the output level at the output terminal T3b is established at a data "0". Accordingly, similar to the case where a data "0" is outputted to the terminal T3a, noise generated at the power supply voltage terminal T1 and ground voltage terminal T2 is considerably reduced by the cancel effects between the charge and discharge currents to and from the load capacitors 110a and 110b, respectively.

As described above, the truth value data and false value data are outputted at the same time to the two data output terminals T3a and T3b. Therefore, noise generated at the power supply voltage terminal and ground voltage terminal can be canceled to thereby considerably reduce the noise level. It is therefore possible to enhance the drive capacity of the "1" level output transistor 11a, "0" level output transistor 12a, "1" level output transistor 11b, and "0" level output transistor 12b, and readily realize high speed memory access.

Furthermore, as shown in FIG. 7, the truth address signal and false address signal are received by the address input circuit AB having the differential amplifier C1. With such an arrangement, it is possible to make relative address noise, generated in correspondence with noise appearing at the chip power source terminals at the time of outputting a data, be in-phase with the truth and false value address signals. For this reason, the semiconductor memory device becomes more resistant against noise, while considerably reducing erroneous addressing and output delay. High speed memory access is therefore further improved.

As appreciated from the foregoing description of the embodiment of this invention, noise on the power source potential and ground potential generated by charge/discharge of an output circuit load capacitor in a semiconductor device such as a memory circuit is canceled out through provision of two load capacitors, one for discharging and the other for charging. As a result, it becomes possible to improve the drive capacity of an output circuit and realize high speed access.

If a false value data becomes necessary for a semiconductor device such as a memory outputting only a truth value data, an external circuit must be provided to the semiconductor device. In addition, a false value data is required to be outputted after the lapse of a response time of the external circuit.

However, with this embodiment, a false value data can be outputted at the same timing of outputting a truth value data, and an external circuit is not required.

What is claimed is:

1. A semiconductor memory chip, comprising:
   address input means for receiving an address signal from outside of said semiconductor memory chip and outputting an internal address signal corresponding to said address signal;
   an address decoder for decoding said internal address signal and outputting a decoded signal;
   a memory cell array having a plurality of memory cells, each cell being capable of storing data and being selected by said decoded signal, said selected memory cell outputting memory cell data; and
   output means provided with first and second output terminals for simultaneously outputting complementary truth and false memory cell data outside of said semiconductor memory chip via said first and second terminals in accordance with data stored in said selected memory cell.

2. A semiconductor memory chip according to claim 1, wherein said first output terminal is connected to a series circuit of a first load capacitor, a first integrated circuit external parasitic resistor, and a first integrated circuit external parasitic inductor, and said second output terminal is connected to a series circuit of a second load capacitor, a second integrated circuit external parasitic resistor, and a second integrated circuit external parasitic inductor.

3. A semiconductor memory chip according to claim 2, wherein said memory cell data outputted from said selected memory cell comprises complementary truth and false memory cell data.

4. A semiconductor memory chip according to claim 3, wherein said output means comprises:
   a first output circuit having first and second switching elements serially connected between a high voltage side and a low voltage side of a power source, the interconnection between said first and second switching elements serving as said output terminal of said truth output; and
   a second output circuit having third and fourth switching elements serially connected between the high voltage side and the low voltage side of the power source, the interconnection between said third and fourth switching elements serving as said output terminal of said false output.

5. A semiconductor memory chip according to claim 4, wherein said truth memory cell data is applied to control terminals of said first and fourth switching elements and said false memory cell data is applied to control terminals of said second and third switching elements.

6. A semiconductor memory chip according to claim 5, wherein said first to fourth switching elements are each N-channel transistors.

7. A semiconductor memory chip according to claim 2, wherein said address signal is an n-bit address signal, and said address input means has n address input circuits in correspondence with said address signal.

8. A semiconductor memory chip according to claim 7, wherein said each of said address input circuits include a differential amplifier circuit for simultaneously receiving as said address signals complementary truth and false addresses from outside of said semiconductor memory chip, to output as said internal address signal complementary truth and false internal address signals.

* * * * *